United States Patent
Wakisaka et al.

(10) Patent No.: US 6,760,352 B2
(45) Date of Patent: Jul. 6, 2004

(54) SEMICONDUCTOR LASER DEVICE WITH A DIFFRACTION GRATING AND SEMICONDUCTOR LASER MODULE

(75) Inventors: Tsuyoshi Wakisaka, Chiyoda-ku (JP); Naoki Tsukiji, Chiyoda-ku (JP); Junji Yoshida, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 153 days.

(21) Appl. No.: 10/092,512

(22) Filed: Mar. 8, 2002

(65) Prior Publication Data

US 2003/0053502 A1 Mar. 20, 2003

(30) Foreign Application Priority Data

Sep. 19, 2001 (JP) ........................................ 2001-285810

(51) Int. Cl.[7] .............................................. H01S 5/022
(52) U.S. Cl. ...................................................... 372/36
(58) Field of Search ........................................ 372/36, 34

(56) References Cited

U.S. PATENT DOCUMENTS

| 5,299,214 A | * | 3/1994 | Nakamura et al. ............. 372/36 |
| 5,559,817 A | * | 9/1996 | Derkits, Jr. et al. ........... 372/36 |
| 6,384,963 B2 | | 5/2002 | Ackerman et al. ........... 359/334 |
| 2002/0121671 A1 | * | 9/2002 | Wakisaka et al. ............ 257/467 |

FOREIGN PATENT DOCUMENTS

| JP | 2000-323118 | 10/2000 |
| JP | 2001-134545 | 5/2001 |
| JP | 2001-228669 | 7/2001 |

* cited by examiner

Primary Examiner—James W. Davie
(74) Attorney, Agent, or Firm—Oblon, Spivak, McClelland, Maier & Neustadt, P.C.

(57) ABSTRACT

In a semiconductor laser device provided with a semiconductor laser element for outputting a laser beam having a plurality of oscillation longitudinal modes at a stimulated Brillouin scattering threshold or less, a submount formed by diamond and set between the semiconductor laser element and a carrier each configured to enable a highly efficient transfer of heat between the semiconductor laser device components.

33 Claims, 16 Drawing Sheets

SEMICONDUCTOR LASER ELEMENT 20

- 10 p-SIDE ELECTRODE
- 7 InGaAsP CAP LAYER
- 6 p-InP CLAD LAYER
- 9 n-InP BLOCKING LAYER
- 8 p-InP BLOCKING LAYER
- 2 n-InP BUFFER LAYER
- 1 n-InP SUBSTRATE
- 11 n-SIDE ELECTRODE
- 3 GRIN-SCH-MQW ACTIVE LAYER
- 2 n-InP BUFFER LAYER
- 13 DIFFRACTION GRATING
- 4 p-InP SPACER LAYER
- 1 N-InP SUBSTRATE

REFLECTION FILM 14
EMISSION-SIDE REFLECTION FILM 15

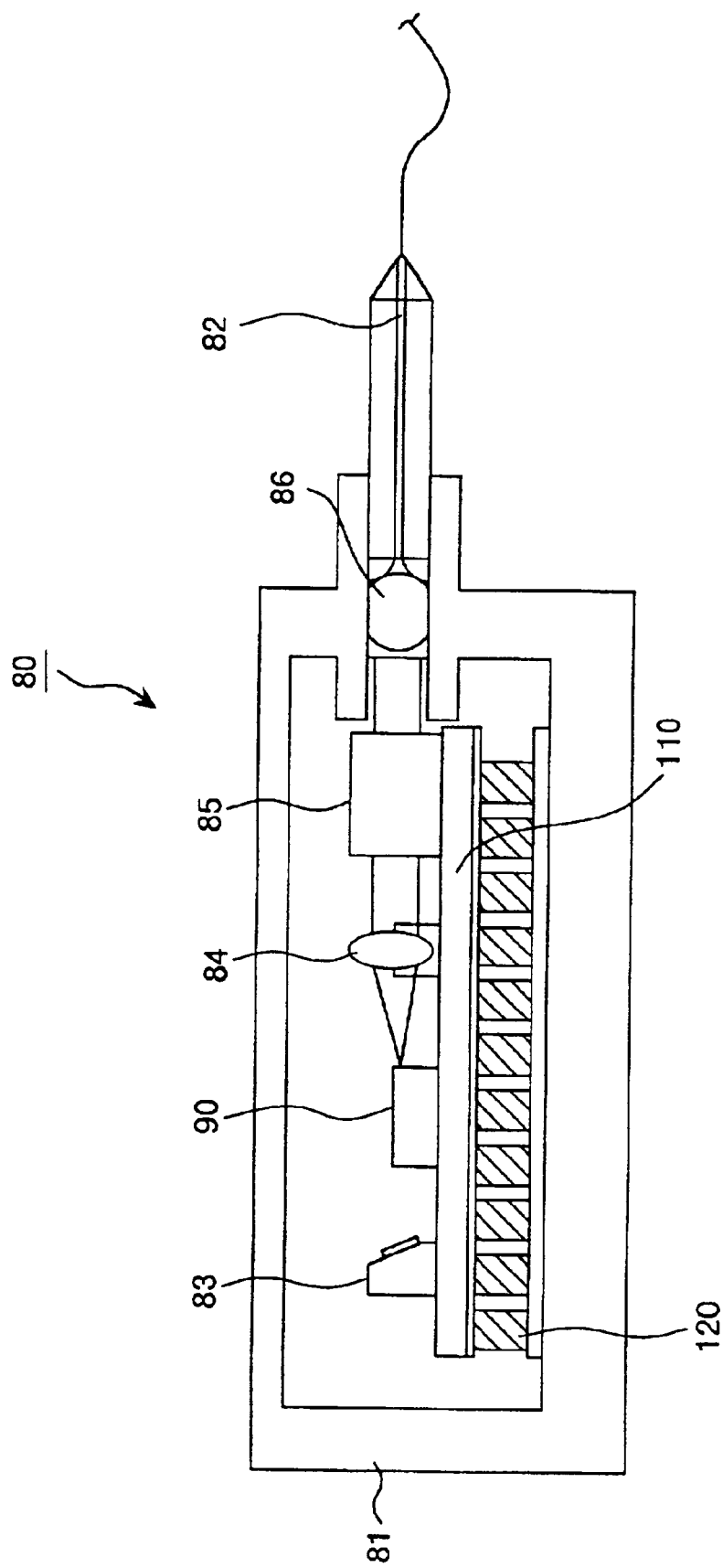

SEMICONDUCTOR LASER DEVICE WITH A DIFFRACTION GRATING AND SEMICONDUCTOR LASER MODULE

CROSS-REFERENCE TO RELATED PATENT APPLICATION

The present document contains subject matter related to that disclosed in commonly owned, co-pending application Ser. No. 10/080,121 entitled SEMICONDUCTOR LASER DEVICE AND SEMICONDUCTOR LASER MODULE, filed on Feb. 22, 2002, the entire content of which is hereby incorporated by reference.

FIELD OF THE INVENTION

The present invention relates to a semiconductor laser device and a semiconductor laser module provided with a semiconductor laser element for outputting a laser beam having a plurality of oscillation longitudinal modes.

BACKGROUND OF THE INVENTION

The recent and rapid spread of the Internet and sudden increase of connection between in-company LANs, has resulted in an increase of the number of communication calls and in an increase in data traffic. This increase in traffic has stressed current optical systems. To prevent the communication performance from deteriorating, the use wavelength division multiplexing (WDM) technologies has advanced and spread.

WDM systems support transmission volumes 100 times larger than the capacity of conventional fiber optic communications by superimposing a plurality of optical signals at different wavelengths on a single fiber. Current WDM systems are capable of long distance transmissions by performing optical amplification with an erbium-doped fiber amplifier (EDFA) or Raman amplifier. An EDFA is an optical fiber amplifier with erbium added. When light having a wavelength of a 1,550 nm band and serving as a transmission signal passes through the EDFA, an additional light emitted by an exciting laser with a wavelength of 1,480 nm or 980 nm is introduced to amplify the signal.

A Raman amplifier is an amplifier capable of directly amplifying signal light by using an already laid optical fiber as an amplifying medium and introducing amplifying light via using stimulated Raman scattering.

Typically for long distance optical transmission with a WDM system, the interval between repeaters must be small due to inefficient amplification. With more repeaters, costs increase. Therefore, to be able to increase the interval between repeaters, one can either increase the output of a semiconductor laser device used for a signal light source and/or improve the amplifying capacity of the repeater.

To meet the above requirements, a semiconductor laser element capable of outputting a laser beam of 250 mW or more is used for EDFA excitation. This higher power level requires high reliability from the semiconductor laser devices.

In the case of a WDM system it is especially important to maintain highly accurate oscillation control and high output operation, not only for the signal light source, but also for the exciting light source used for amplification. The heat of a semiconductor laser element produced due to current injection is known to be a large factor for degrading the oscillation control and high output operation. To compensate for this thermal degradation problem, various conventional approaches are used.

For example, in the case of a conventional semiconductor laser device, a thermistor for measuring the temperature of a semiconductor laser element is often set nearby the semiconductor laser element so that the temperature of the semiconductor laser element can be controlled by an electrothermal element such as a Peltier element.

FIG. 18 is a front view showing a schematic configuration of a conventional semiconductor laser device. In FIG. 18, a submount 102 formed by AlN having an insulating property and a high heat conductivity is set on a carrier 101 formed by CuW. A semiconductor laser element 103 for outputting a laser beam of a predetermined wavelength is set on the submount 102. A submount 104 formed by AlN is set on the carrier 101 and, a thermistor 105 for measuring the temperature of the semiconductor laser element 103 is set on the submount 104.

The semiconductor laser element 103 and the submount 102 are joined to each other through a metallic thin film 102a. The metallic thin film 102a contains layers of Ti, Pt, and Au at thicknesses of 60 nm, 200 nm, and 600 nm respectively. The semiconductor laser element 103 and submount 102 are joined on the metallic thin film 102 by a solder material such as AuSn. The thermistor 105 and submount 104 are also joined through a metallic thin film 104a.

The face of the semiconductor laser element 103 to be joined with the submount 102 serves as a p-side electrode and the upper face serves as an n-side electrode. The semiconductor laser element 103 is set so that the active layer serving as a main heat generating source is present at the p-side electrode side and located nearby the submount 102. The n-side electrode is connected to a negative electrode by an Au wire 106a. The p-side electrode is connected to the carrier 101 at the positive electrode side through the metallic thin film 102a and an Au wire 106b.

Submount 102 secures the insulation of the semiconductor laser element 103 and functions as a heat sink of the semiconductor laser element 103. In the case of the carrier 101, as illustrated, the bottom is joined to a CuW base 110 by AuSn solder. The base 110 is set on a Peltier element 120. The Peltier element 120 is controlled by a temperature control section (not illustrated) correspondingly to the temperature detected by the thermistor 105. As a result, the temperature of the semiconductor laser element 103 is controlled by the thermistor 105, Peltier element 120, and the temperature control section.

The thermistor 105 is also insulated from the carrier 101 by the submount 104 to detect the temperature of the semiconductor laser element 103 through the submount 102, carrier 101, and submount 104, each of which has a high heat conductivity.

The heat generated in the semiconductor laser element 103 is conducted to the thermistor 105 through the metallic thin film 102a, submount 102, metallic thin film 102b, carrier 101, metallic thin film 104b, submount 104, and metallic thin film 104a in order. As recognized by the present inventors the heat conducting distance degrades overall operations as the actual temperature detection of the semiconductor laser element 103 is delayed. Moreover, the generated heat passes through the metallic thin films 102a, 102b, 104b, and 104a that are joined to each other by four AuSn solder joints. However, because the AuSn solder joints are used for the junction they respectively have a large heat joints resistance, and so the heat resistance of the above heat conducting path is increased. Moreover, because of the deterioration of the temperature detection accuracy, the temperature control accuracy is also deteriorated. Thus, in conventional WDM applications, the oscillation wavelength of the semiconductor laser element 103 is prone to becoming unstable due to heat generated at high powers, and the system optical output and service life are deteriorated.

Another limitation is present in conventional WDM applications. When supplying current to a semiconductor laser element in order to obtain a high optical output, a voltage drop of an Au thin film in the metallic thin film 102a occurs. Assuming the total resistance of the Au thin film as 0.12 Ω, and an inter electrode voltage of a semiconductor laser element when a current of 1 A circulates through the semiconductor laser element equal to approximately 2V, the voltage drop of the semiconductor laser element in the resonator length direction becomes non-uniform by 0.12 V. This leads to the current injection to the semiconductor laser element to become non-uniform and the light density in the active layer also to become non-uniform. The present inventors have discovered this to accelerate deterioration of a device's optical output and service life.

All of the above described limitations are more pronounced in a semiconductor laser element that includes a diffraction grating. Examples of such laser elements include those disclosed in Japanese Patent Application No. 2000-323118, Japanese Patent Application No. 2001-134545, and Japanese Patent Application No. 2002-228669 filed on Oct. 28, 2000, May 1, 2001 and Jul. 27, 2001 respectively in the Japanese Patent Office, the entire contents of which being incorporated herein by reference. These types of laser elements are configured to output a laser beam with a plurality of oscillation longitudinal modes at or below a threshold at which stimulated Brillouin scattering occurs. These types of laser elements suffer unique degradations in performance due to temperature effects. Specifically, the temperature of a semiconductor laser element rises with increases in the current injected into the laser element's active layer. This temperature increase causes the refractive index of the diffraction grating layer to change. This change in refractive index causes the selection wavelength of the diffraction grating to shift such that the desired central output wavelength cannot be obtained. Therefore, in the case of an iGM laser that has a diffraction grating, the present inventors determined that it is desirable to go beyond conventional measures to accommodate the heat producing high powers.

SUMMARY OF THE INVENTION

This invention provides a semiconductor iGM laser device and a semiconductor iGM laser module capable of preventing the optical output and service life of a high output semiconductor laser element from deteriorating the way they do with conventional device. This is achieved by using new materials in such devices and modules to enable a reduction in the number of interfaces between a laser element and a temperature measuring device, as well as a reduction in the number of interfaces between a laser element and a Peltier module. In addition, performance is enhanced by improving the uniformity of voltage drop of the semiconductor laser element in the resonator length direction by distributing driving currents along a length of the resonator cavity.

The first configuration of the present invention includes a semiconductor laser device having a first mount, a second mount formed by a heat sink having a heat conductivity of 500 W/(m*K) or more and set onto the first mount, and a semiconductor laser element joined on to the second mount through a multi-layer film including a gold thin film. The semiconductor laser device also includes a thermistor set on a third mount which is joined onto the first mount through a multi-layer film, including a gold thin film.

The second configuration of the present invention includes a semiconductor laser device having a first mount, a second mount formed by a heat sink having a heat conductivity of 500 W/(m*K) or more and set onto the first mount, and a semiconductor laser element joined on to the second mount through a multi-layer film, including a gold thin film. The semiconductor laser device also includes a thermistor joined directly onto the first mount through a multi-layer film, including a gold thin film.

The third configuration of the present invention includes a semiconductor laser device having a first mount, a second mount formed by a heat sink having a heat conductivity of 500 W/(m*K) or more and set onto the first mount, and a semiconductor laser element joined on to the second mount through a multi-layer film, including a gold thin film. The semiconductor laser device also includes a thermistor also joined onto the second mount through a multi-layer film, including a gold thin film.

A fourth configuration of the present invention includes a semiconductor laser module having the semiconductor laser device according to any one of the first to third aspects, a temperature controlling element for controlling the temperature of the above semiconductor laser element in accordance with the temperature output from the above temperature measuring element, and a fourth mount set onto the above temperature controlling element, in which the above semiconductor laser device is set onto the fourth mount and the above semiconductor laser element is temperature controlled through the fourth mount.

BRIEF DESCRIPTION OF THE DRAWINGS

Other objects and features of this invention will become better understood from the following description with reference to the accompanying drawings.

FIG. 17 is a longitudinal sectional view showing a semiconductor laser module of fourth embodiment.

DETAILED DESCRIPTION

The present invention has been conceived in order to solve the above described problems of conventional devices and modules regarding heat dissipation and thermally-induced laser performance degradations. Embodiments of a semiconductor laser device and a semiconductor laser module of the present invention are described below in detail by referring to the accompanying drawings. Throughout this discussion, it is assumed that the present invention is tailored for a "semiconductor laser device" configured to output a laser beam with a plurality of oscillation longitudinal modes as disclosed in Japanese Patent Application No. 2000-323118, Japanese Patent Application No. 2001-134545, and Japanese Patent Application No. 2001-228669, the entire contents of each of which being incorporated herein by reference.

Figure 1:
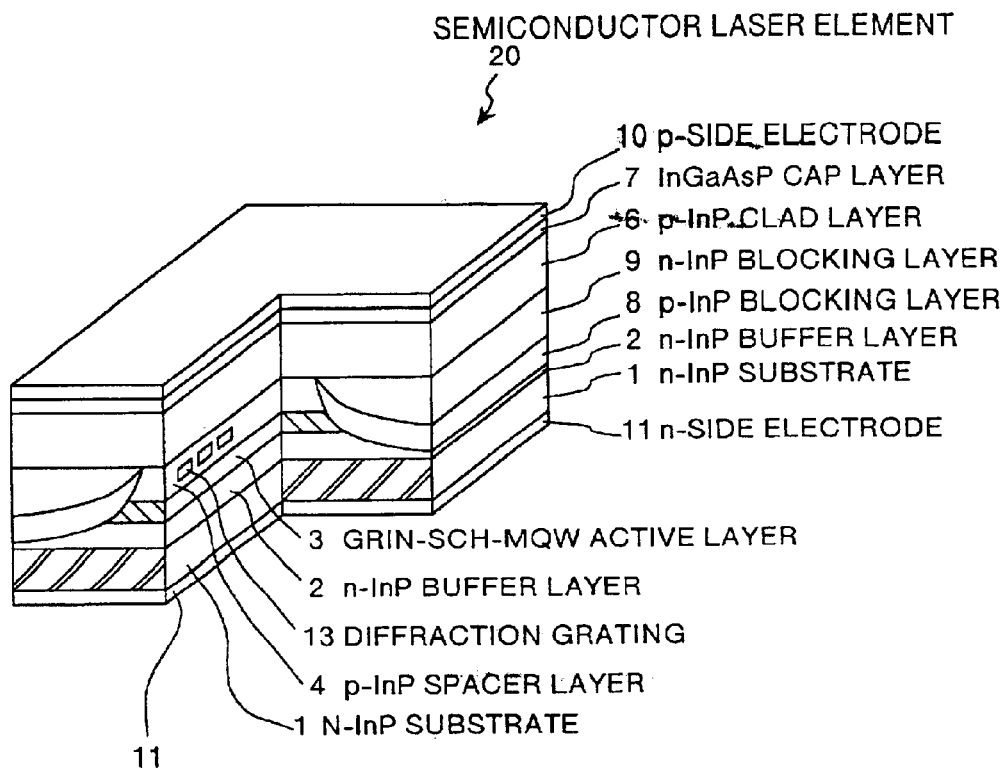
FIG. 1 is a perspective sectional view showing a schematic configuration of a semiconductor laser element provided for a semiconductor laser device of a first embodiment.
Figure 2:
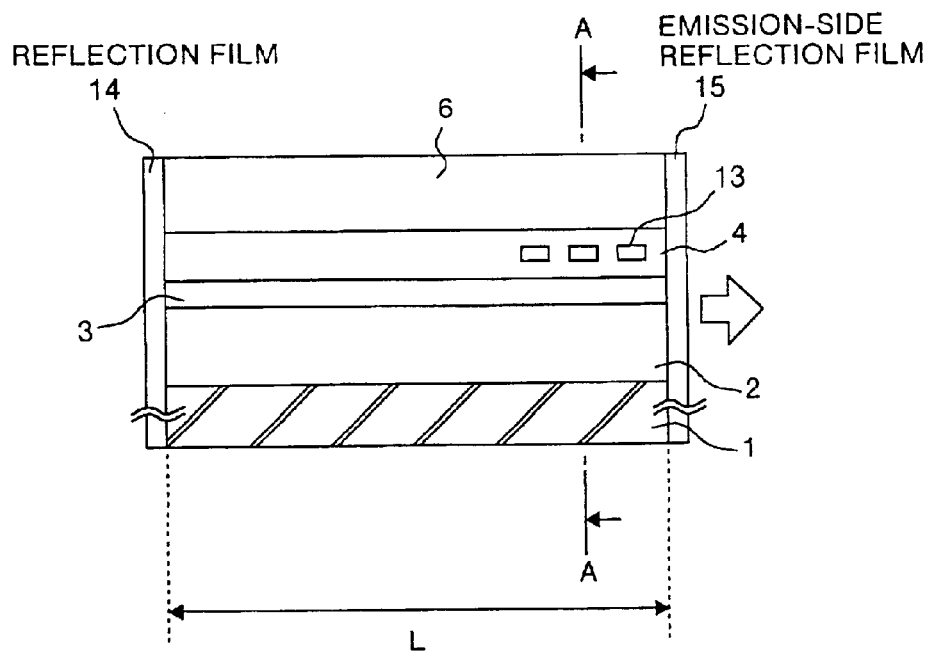
FIG. 2 is a longitudinal sectional view of a semiconductor laser element provided for the semiconductor laser device of the first embodiment in its longitudinal direction.
Figure 3:
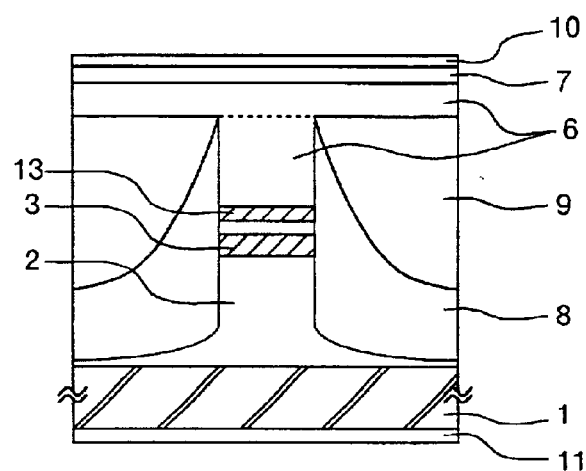
FIG. 3 is a sectional view of the semiconductor laser element provided for the semiconductor laser device of the first embodiment, taken along the line A—A in FIG. 2.

FIG. 1 is a perspective sectional view showing a schematic configuration of a semiconductor laser element in each of this invention's embodiments. FIG. 2 is a longitudinal sectional view of the semiconductor laser element shown in FIG. 1. FIG. 3 is a sectional view of the semiconductor laser element shown in FIG. 2, taken along the line A—A in FIG. 2. In FIG. 1, the semiconductor laser element 20 is constituted by forming an n-InP buffer layer 2 also serving as a buffer layer made of n-InP and a lower clad layer, GRIN-SCH-MQW (Graded Index Separate Confinement Heterostructure Multi Quantum Well) active layer 3 having a compressive strain, a p-InP spacer layer 4, a p-InP clad layer 6, and an InGaAsP cap layer 7 on the surface of an n-InP substrate 1 in order.

As shown in FIG. 2, a reflection film 14 having a high light reflectance of 80% or more is formed on the light reflection edge of the semiconductor laser element serving as one end face of the element 20 in its longitudinal direction and an emission side reflection film 15 having a low light reflectance of 2% or less, preferably a low light reflectance of 1% or less is formed on the light emission edge of the element 20 serving as its other end face. The light generated in the GRIN-SCH-MQW active layer 3 of an optical resonator formed by the reflection film 14 and the emission side reflection film 15 is reflected from the reflection film 14 and emitted as a laser beam through the emission side reflection film 15.

Also as shown in FIG. 2, the semiconductor laser element 20 has a diffraction grating 13 made of p-InGaAsP periodically formed in the p-InP spacer layer 4. Particularly in this case, it is assumed that the diffraction grating 13 extends up to 100 $\mu$m from the emission side reflection film 15 so that a laser beam having a central wavelength of 1.48 $\mu$m is selected out of laser beams generated in the gain area of the GRIN-SCH-MQW active layer 3 and is formed by having a film thickness of 20 nm and at a pitch of approximately 220 nm. It is preferable that the diffraction grating 13 is formed in contact with the emission side reflection film 15. Instead of bringing the grating 13 into contact with the film 15, however, it is also possible to form the diffraction grating 13 separately from the emission side reflection film 15 in a range in which the grating 13 shows its function, that is, in a range of 20 to 100 $\mu$m. Moreover, it is allowed that the diffraction grating 13 is left at the reflection film 14 side due to the fluctuation of the cleavage position of the semiconductor laser element 20 caused in fabrication of the semiconductor laser element 20.

As shown in FIG. 3, the upper portion of the n-InP buffer layer 2, GRINSCH-MQW active layer 3, and p-InP spacer layer 4 including the above diffraction grating 13 are formed like a mesa stripe and the both sides of the mesa stripe are embedded by a p-InP layer 8 and an n-InP blocking layer 9 respectively formed as a current blocking layer. A p-side electrode 10 is formed on the surface of the InGaAsP cap layer 7 and an n-side electrode 11 is formed on the back of the n-InP substrate 1.

When using the semiconductor laser element 20 having the above configuration as a Raman amplifier exciting light source, the oscillation wavelength o is set to 1,100 to 1,550 nm and the resonator length L is set in an inclusive range of 800 through 3,200 $\mu$m. In general, the interval $\Delta\lambda$ between longitudinal modes generated by the resonator of a semiconductor laser element can be shown by the following expression by assuming an equivalent refractive index as "n". That is:

$$\Delta\lambda = \lambda o^2/(2*n*L)$$

In this case, when setting the oscillation wavelength $\lambda o$ to 1,480 nm and an effective refraction index to 3.5, the interval $\Delta\lambda$ between longitudinal modes becomes approximately 0.39 nm when the resonator length L is equal to 800 $\mu$m and becomes approximately 0.1 nm when the length L is equal to 3,200 $\mu$m. That is, as the resonator length L is increased, the longitudinal-mode interval $\Delta\lambda$ decreases and a selection condition for oscillating a laser beam of a single longitudinal mode becomes more severe.

Figure 4:
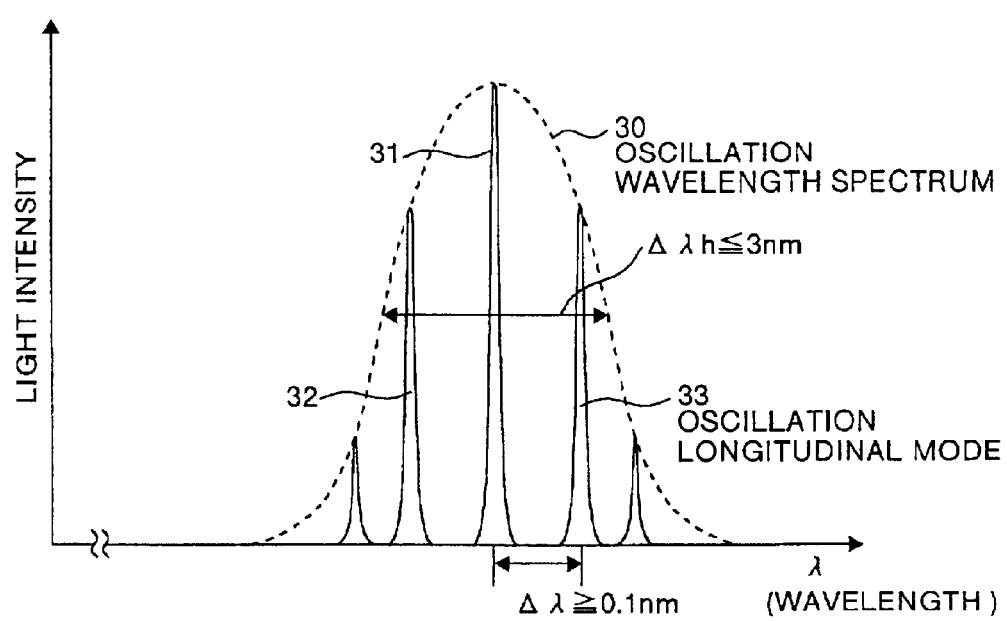
FIG. 4 is a graph showing a selective wavelength characteristic by a diffraction grating of the semiconductor laser element provided for the semiconductor laser device of the first embodiment.

The diffraction grating 13 selects a longitudinal mode in accordance with its center selective wavelength characteristic. FIG. 4 is a graph for explaining a selective wavelength characteristic by the diffraction grating 13. The selective wavelength characteristic by the diffraction grating 13 is shown as the illustrated oscillation wavelength spectrum 30.

As shown in FIG. 4, the semiconductor laser element 20 is designed so that a plurality of oscillation longitudinal modes are present in a wavelength selection characteristic shown by the half-width $\Delta\lambda k_h$ of the oscillation wavelength spectrum 30. In the case of a conventional semiconductor laser element, when setting the resonator length L to 800 $\mu$m or more, a semiconductor laser device having the resonator length L cannot be used because single longitudinal-mode oscillation is difficult. The semiconductor laser element 20 outputs a laser beam including a plurality of oscillation longitudinal modes in the half-width $\Delta\lambda h$ of an oscillation wavelength spectrum by positively setting the resonator length L to 800 µm or more. In FIG. 4, three oscillation longitudinal modes 31 to 33 are included in the half-width $\Delta\lambda h$ of an oscillation wavelength spectrum.

Figure 5B:
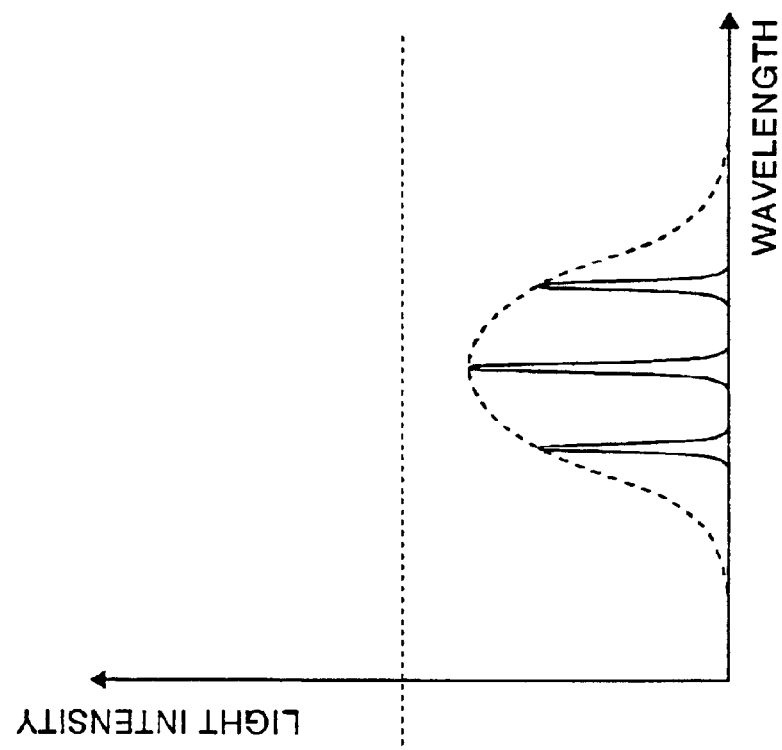
FIGS. 5A and 5B are illustrations showing profiles of a laser beam having a single longitudinal mode and a laser beam having a plurality of oscillation longitudinal modes.
Figure 5A:
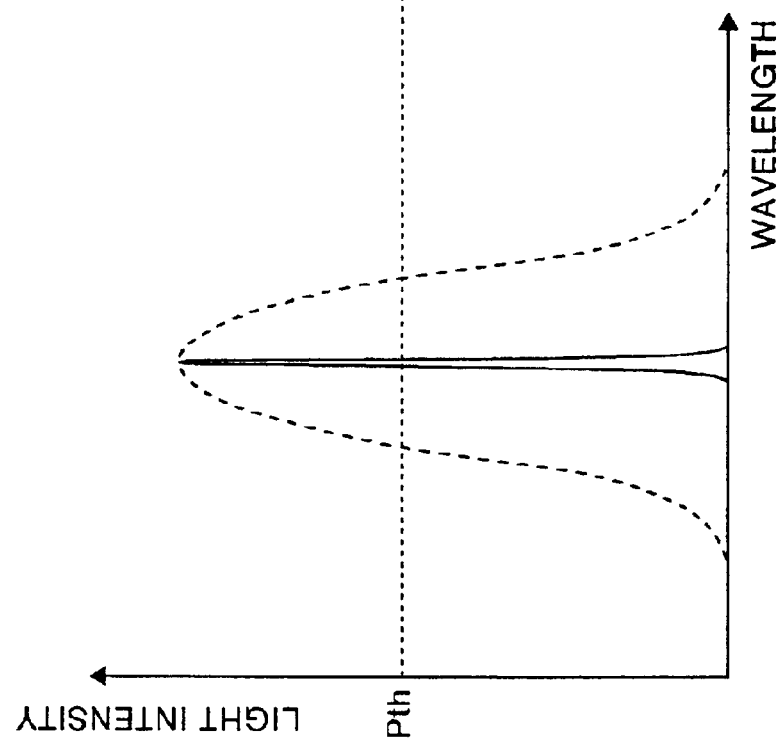

When using a laser beam having a plurality of oscillation longitudinal modes, it is possible to suppress the peak value of a laser output and obtain a high aggregate laser output power value. FIGS. 5A and 5B are illustrations for explaining profiles of a laser beam having a single longitudinal mode and a laser beam having a plurality of oscillation longitudinal modes. For example, the semiconductor laser element 20 has the profile shown in FIG. 5B and makes it possible to obtain a high laser output having a low peak value. However, FIG. 5A is the profile of a semiconductor laser device having a single longitudinal mode when obtaining the same laser output, in which a high peak value is present.

In this case, when using the semiconductor laser element 20 as the exciting light source of a Raman amplifier, it is preferable to increase the exciting light output power in order to increase the Raman gain. However, when the peak value of the power is too high, degradation due to stimulated Brillouin scattering occurs and noise increases. As shown in FIG. 5A, stimulated Brillouin scattering occurs when a laser output exceeds the threshold value Pth generated by the stimulated Brillouin scattering. Therefore, the semiconductor laser element 20 is configured emit a laser beam in a plurality of oscillation longitudinal modes by suppressing a peak value to the threshold value Pth of stimulated Brillouin scattering or less as shown in FIG. 5B. This results in laser output substantially the same as the case of the profile shown in FIG. 5A. Thus, it is possible to obtain a high exciting light output power and, as a result, obtain a high Raman gain.

In FIG. 4, the wavelength interval (mode interval) $\Delta\lambda$ between the oscillation longitudinal modes 31 to 33 is set to 0.1 nm or more. This is because the probability of simulated Brillouin scattering occurrence rises if the mode interval $\Delta\lambda$ is equal to or less than 0.1 nm when using the semiconductor laser element 20 as the exciting light source of a Raman amplifier. As a result, it is preferable that the above resonator length L is set to 3,200 µm or less in accordance with the above expression of the mode interval $\Delta\lambda$. It is preferable that the number of oscillation longitudinal modes included in the half-width $\Delta\lambda h$ of the oscillation wavelength spectrum 30 is two or more.

As described above, the semiconductor laser element 20 set in the semiconductor laser device is configured to stably produce a high laser output without causing stimulated Brillouin scattering. This is because the diffraction grating 13 and the resonator length L are set so that two or more oscillation longitudinal modes are included in the half-width of an oscillation wavelength spectrum.

Figure 6A:
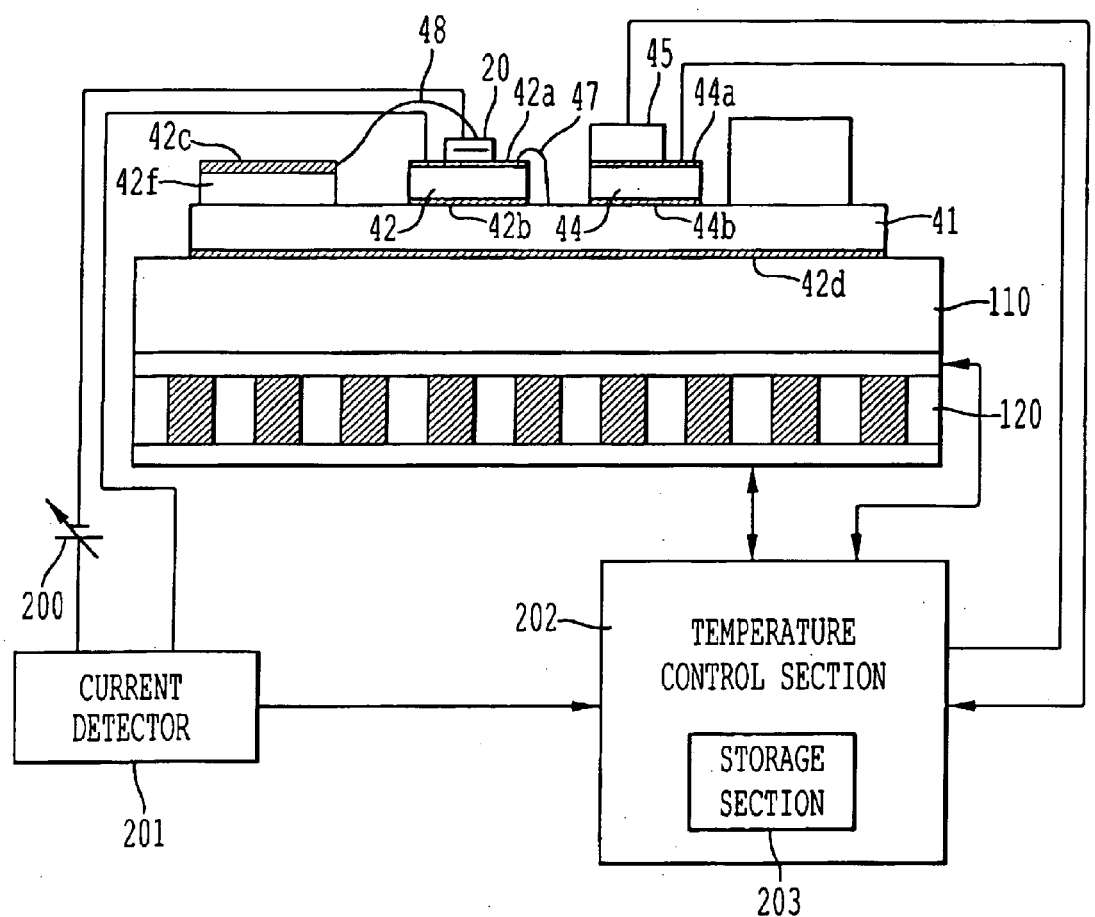
FIGS. 6A and 6B are illustrations showing a front view and a top view of the semiconductor laser device of the first embodiment and its control system.

The semiconductor laser device of the first embodiment is described below. FIG. 6A is an illustration showing a front view of the semiconductor laser device of the first embodiment and its control system. In the case of the semiconductor laser device shown in FIG. 6A, a submount 42 made of diamond having an insulating characteristic and a high heat conductivity is formed on a carrier 41 made of CuW and the above semiconductor laser element 20 is formed on the submount 42. Also, a submount 44 made of AlN is formed on the carrier 41 and a thermistor 45 for measuring the temperature of the semiconductor laser element 20 is formed on the submount 44. An optical monitor (not shown) may also be mounted on the carrier 41.

Figure 6B:
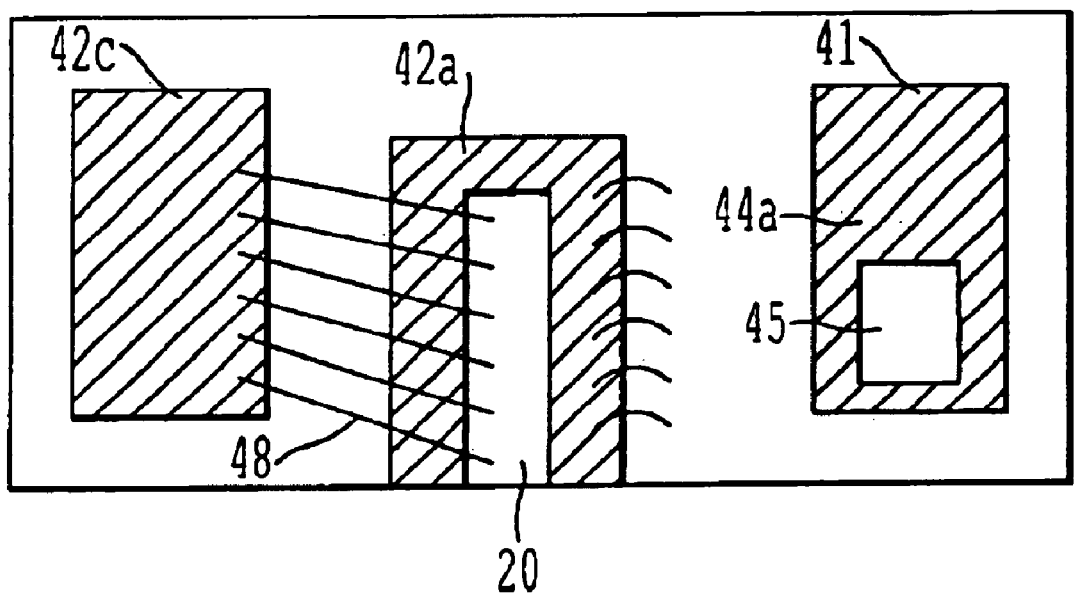

The semiconductor laser element 20 is joined with the submount 42 through a metallic thin film 42a. The submount 42 is joined with the carrier 41, through a metallic film 42b. The junction face of the semiconductor laser element 20 with the submount 42 is a p-side electrode and the upper face of the element 20 is an n-side electrode. Since the active layer of the semiconductor laser element 20 is the main heat generating source, this layer is configured to be the p-electrode and is placed on the submount 42. As shown in FIG. 6A, the lower portion of the carrier 41 is joined to a base 110 made of CuW by AuSn solder 42d. The base 110 is formed on a Peltier element 120. FIG. 6B is a top view of the first embodiment. Metallic thin films 42a–42c are patterned and formed so as to be insulated from each other. The metallic thin films 42a–42c are formed as a structure in which Ti, Pt, and Au are layered in order from the carrier 41 side with thicknesses of 60 mn, 200 mn, and 5,000 mn, respectively.

The p-side electrode of the semiconductor laser element 20 at the outside is joined so as to face the submount 41 and the n-side electrode serves as an upper face. The p-side electrode of the semiconductor laser element 20 and submount 41 are electrically connected to each other through the metallic thin film 42a and Au wire 47. The n-side electrode of the semiconductor laser element 20 and metallic thin film 42c, which is mounted on submount 41 via electrode mount 42f, are electrically connected to each other through a plurality of wires 48. The metallic thin film 42a serves as a negative electrode of the semiconductor laser element 20 and the metallic thin film 42c serves as a positive electrode of the semiconductor laser element 20.

As shown in FIG. 6B a plurality of wires 48 are used to electrically connect the inside electrode and the metallic thin film 42c of the semiconductor laser element 20 to each other so as to increase the current carrying area. This enables a reduction in the resistance value produced along the wiring portion and reduces a voltage drop along the wiring portion. This reduction of voltage drop contributes to suppression of heat produced and increases the power ratio used for the laser beam output. By making the joints between the wires 48 almost equal in interval it is possible to disperse current distribution along the length of the semiconductor laser 20 and decrease the non-uniformity of voltage drop along the length. This prevents both the optical output and the service life of the device from deteriorating.

Figure 7A:
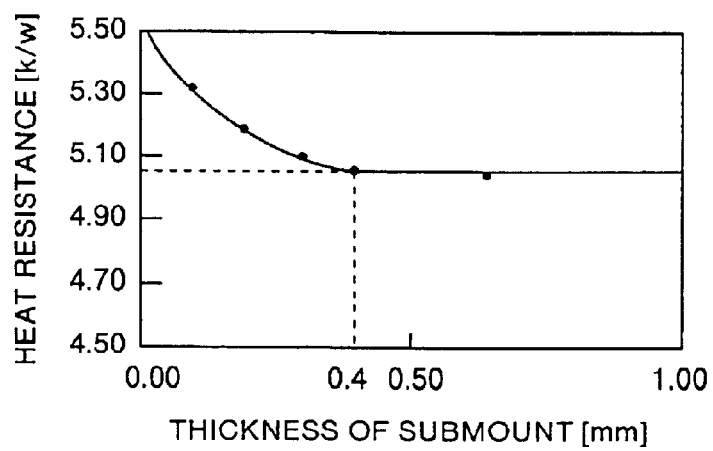
FIGS. 7A to 7C are illustrations of calculated data showing relations between sizes and heat resistances of a diamond submount provided for the semiconductor laser device of the first embodiment.
Figure 7B:
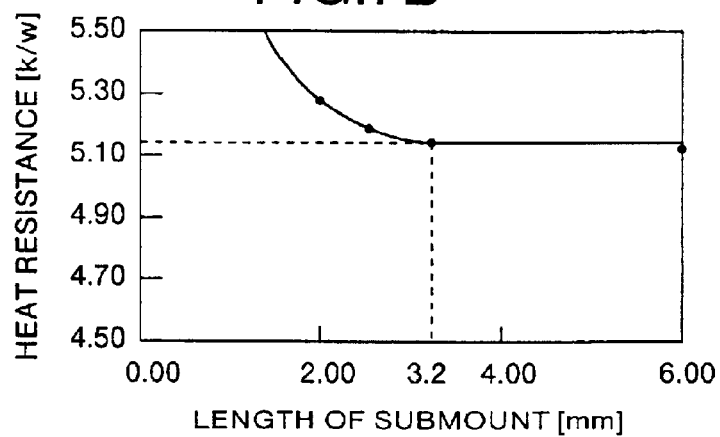
Figure 7C:
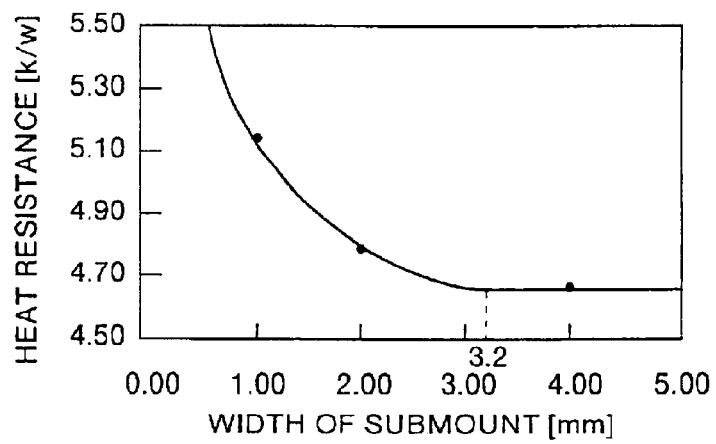

The submount 42 is formed from polycrystal diamond synthesized through chemical vapor deposition (CVD). The method for sizing the diamond submount is described below. FIGS. 7A to 7C are illustrations of calculated data showing the relation between size and heat resistance of the submount 42 made of diamond. FIG. 7A is a graph showing the relation between thickness and heat resistance when fixing the length of the submount 42 to 2.5 mm and the width to 1.0 mm. FIG. 7B is a graph showing the relation between width and heat resistance when fixing the length of the submount 42 to 0.2 mm and the width to 1.0 mm. FIG. 7C is a graph showing the relation between width and heat resistance when fixing the length of the submount 42 to 2.5 mm and the thickness to 0.2 mm. From each graph, it is found that a heat resistance converges into a minimum value as a size increases. Therefore, in accordance with these graphs, it is possible to estimate the optimum size of a submount at which heat transference is optimized.

Figure 8:
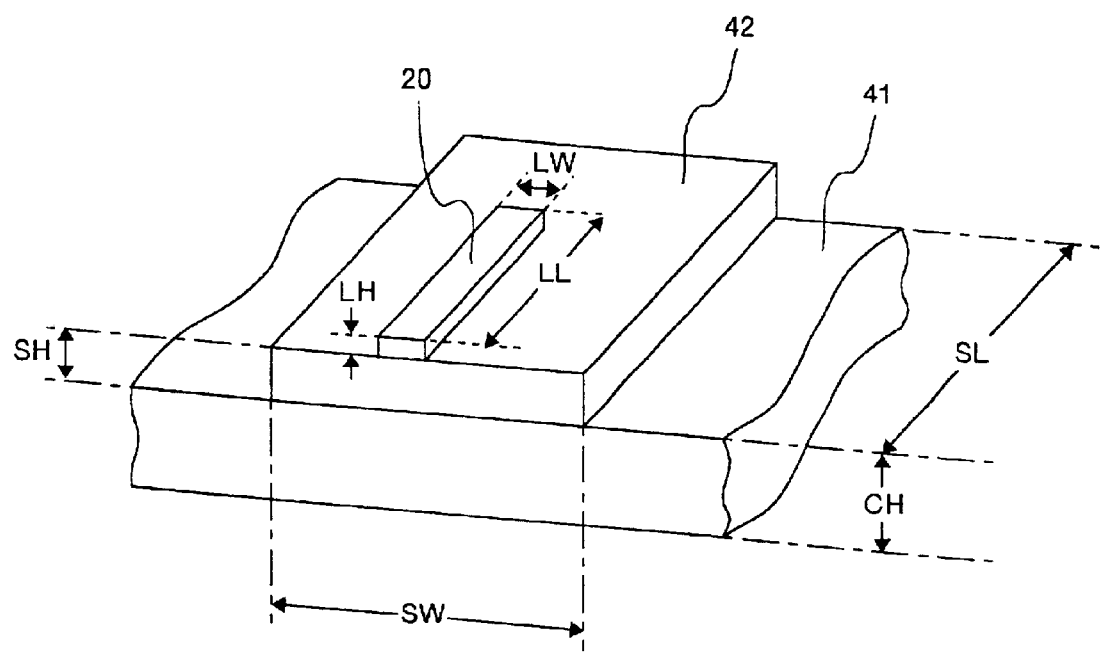
FIG. 8 is a perspective view for explaining an optimum size of a diamond submount provided for the semiconductor laser device of the first embodiment.

FIG. 8 is a perspective view for explaining the optimum size of the submount 42. By estimating a size at which a heat resistance is cost effectively minimized in accordance with the experiment data shown in FIG. 7, it is preferable to form the diamond submount 42 at a thickness SH=0.4 mm, a length SL=3.2 mm, and a width SW=3.2 mm. When the semiconductor laser element 20 has a thickness LH=2.0 mm, a length LL=1.5 mm, and a width LW=0.35 mm. Moreover, it is also possible to use a structure in which the thickness SH of the diamond submount 42 is set to 0.3 mm, the length SL of it is set to 2.7 mm, and the width SW of it is set to 1.0 mm, resulting heat transference characteristic 1.2 times larger than the above minimum heat resistance.

Figure 9A:
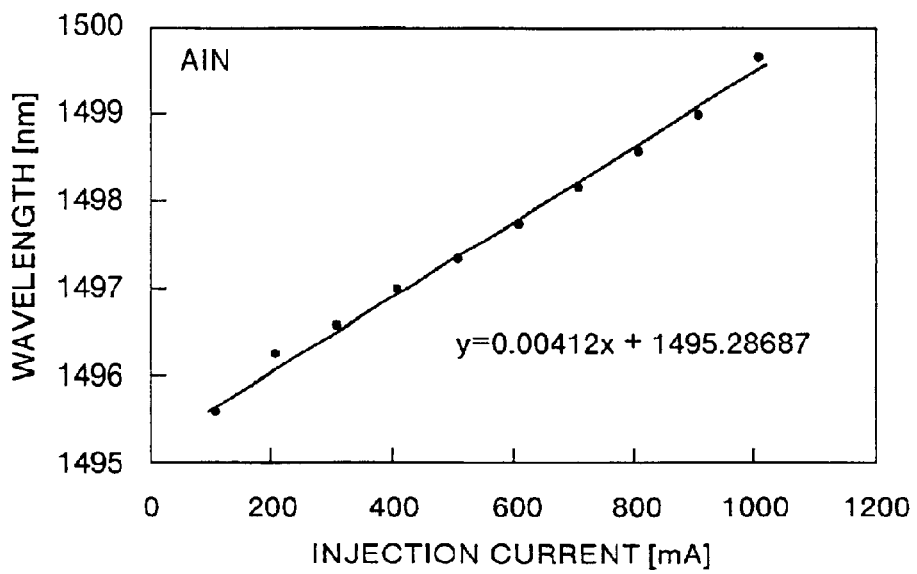
FIGS. 9A and 9B are illustrations showing experimental data showing relations between injection currents and oscillation wavelengths when using AlN for a submount and when using diamond for a submount.
Figure 9B:
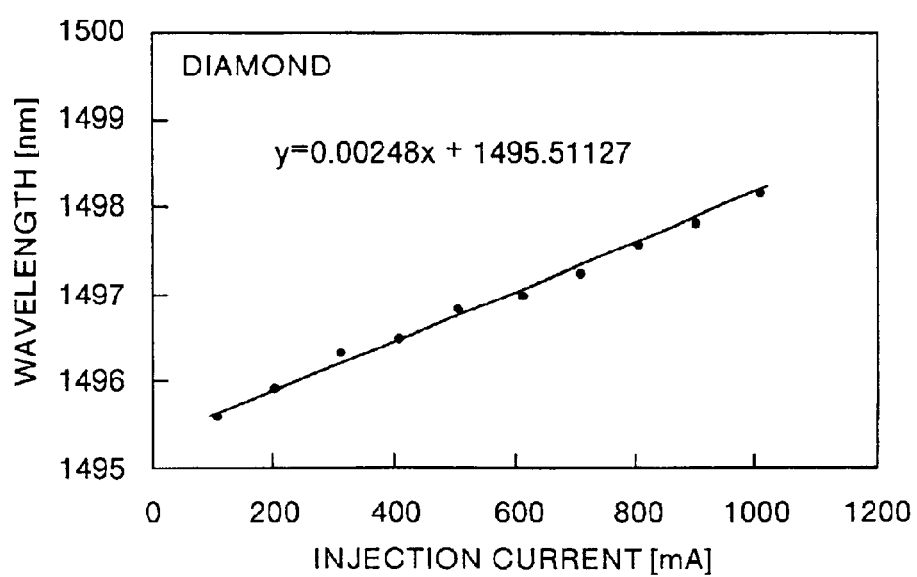
Figure 18:
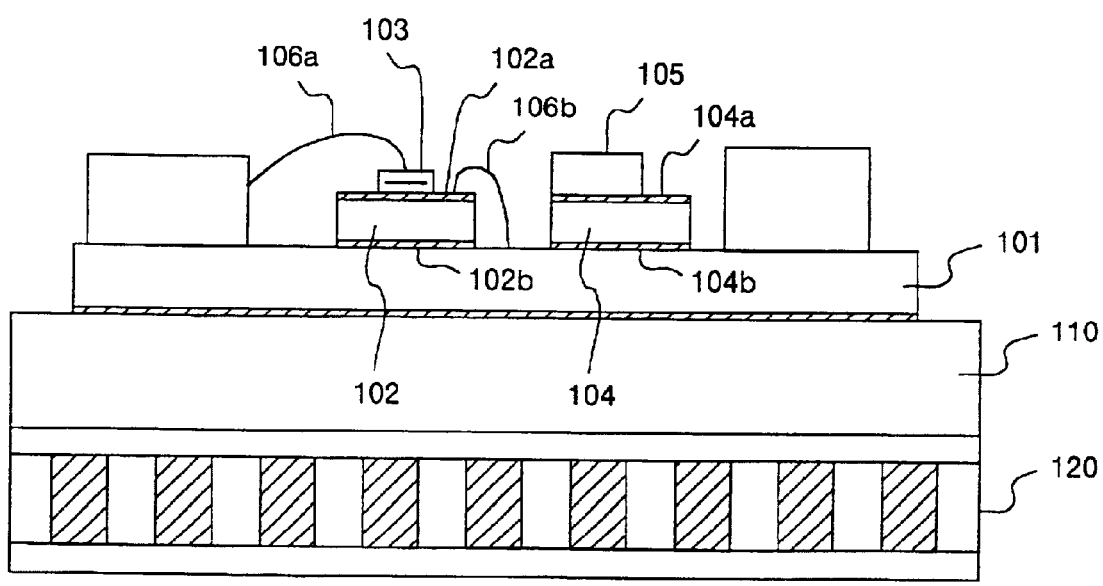
FIG. 18 is a front view showing a schematic configuration of a conventional semiconductor laser device.

FIG. 9A shows the injection current oscillation wavelength characteristic when using AlN for the conventional submount 102 (FIG. 18) and FIG. 9B shows the injection current oscillation wavelength characteristic when using diamond for the submount 42 of this invention. The graph in FIG. 9A shows that in the conventional case the oscillation wavelength shifts from approximately 1,495.5 nm to approximately 1,499.5 nm as the injection current is increased from 100 mA to 1,000 mA. FIG. 9B shows that the oscillation wavelength in the first embodiment shifts from approximately 1,495.5 nm to approximately 1,498.0 nm as the injection current is increased from 100 mA to 1,000 mA. Thus, with a diamond submount 42, the shift of the oscillation wavelength due to temperature is minimized compared to the conventional case of an AlN mount 102 (FIG. 18). Minimizing the temperature-driven shift of wavelength equates to decreasing the temperature control range presented to temperature control section 202 and, thus, makes it possible to more quickly maintain the semiconductor laser element 20 at an optimal operating temperature.

Figure 10:
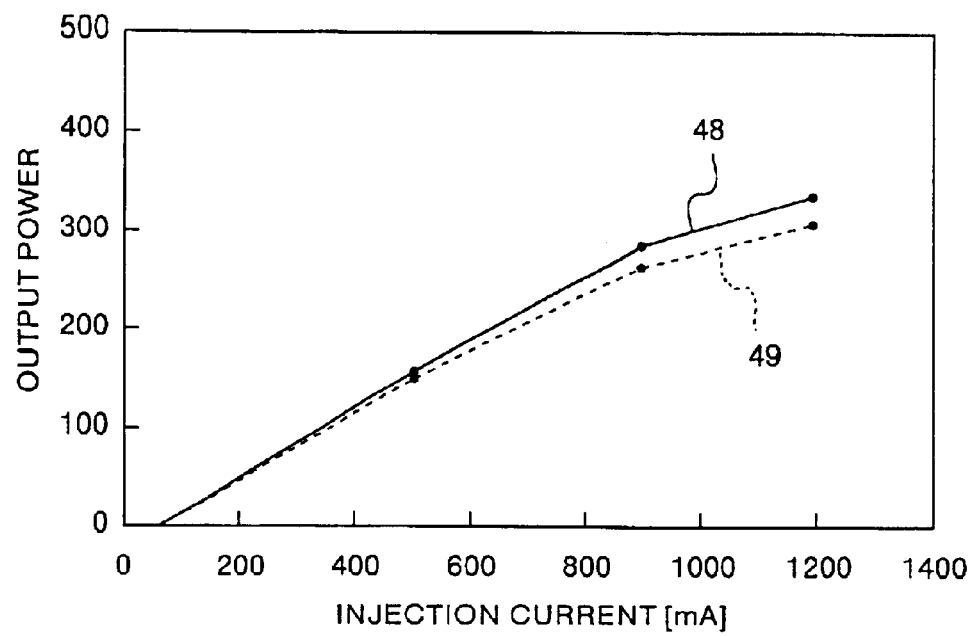
FIG. 10 is an illustration showing experimental data showing relations between injection currents and output powers of laser beams when using AlN for a submount and when using diamond for a submount.

FIG. 10 characterizes experiment data showing relations between injection current and laser beam output power when using an AlN submount 102 (FIG. 18) and a diamond submount 42. In FIG. 10, the continuous line 48 shows the injection current output power characteristic when using diamond for the submount 42 and the dotted line 49 shows the injection current output power characteristic when using AlN for the submount 102. In FIG. 10, the laser beam output power increases as the injection current increases in cases of the line 48 and line 49. However, the output power is larger in the case of line 48. That is, a larger output power for a given injection current is possible when using the diamond submount 42 compared to using the AlN submount 102. Specifically, when the submount is made of AlN, when injection currents equal 500 mA, power output equals 159.4 mW; 900 mA of injection current results in power output equal to 264.2 mW; and when injection current equals 1200 mA, power output equals 312.2 mW. However, when the submount is made of diamond injection, injection currents of 500 mA result in power outputs of 168.1 mW, 900 mA injection currents result in power outputs of 281.7 mW, and 1200 mA injection currents result in an output power of 336.2 mW.

The effect upon semiconductor laser device control is briefly described below by referring to FIG. 6A. When a variable power source 200 applies a predetermined voltage between the n-side electrode and p-side electrode of the semiconductor laser element 20, a driving current is supplied to the semiconductor laser element 20 and, thereby, the semiconductor laser element 20 oscillates and outputs a laser beam having a desired wavelength from an active layer. The above driving current is detected by a current detector 201 and the detection result is further input to the temperature control section 202.

The temperature control section 202 has a storage section 203 for holding a control function and computes a control temperature by applying the above driving current to the control function. The thermistor 45 is connected to the temperature control section 202 enabling the temperature control section 202 to control the current direction and level to the Peltier element 120. Thus, when the temperature detected by the thermistor 45 exceeds a predetermined upper threshold, the Peltier element 120 cools the laser device and when the temperature falls below a lower threshold the Peltier element 120 heats the laser device.

Thus, with the first embodiment it is possible to reduce the shift of a selective wavelength in a diffraction grating, to improve the current pair light transformation efficiency from an injection current to a laser beam, and to effectively obtain a higher laser output for a given injection current.

The semiconductor laser device of the second embodiment is described below. Whereas in the first embodiment a diamond submount is used for the semiconductor laser element and an AlN submount is used for the thermistor, in the second embodiment the thermistor is directly mounted on the carrier without a submount.

Figure 11:
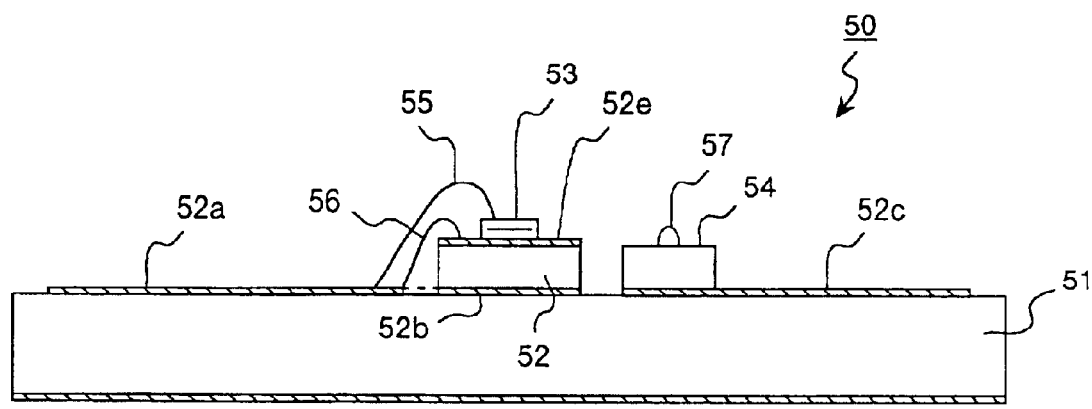
FIG. 11 is an illustration showing a configuration of a semiconductor laser device of second embodiment.
Figure 12A:
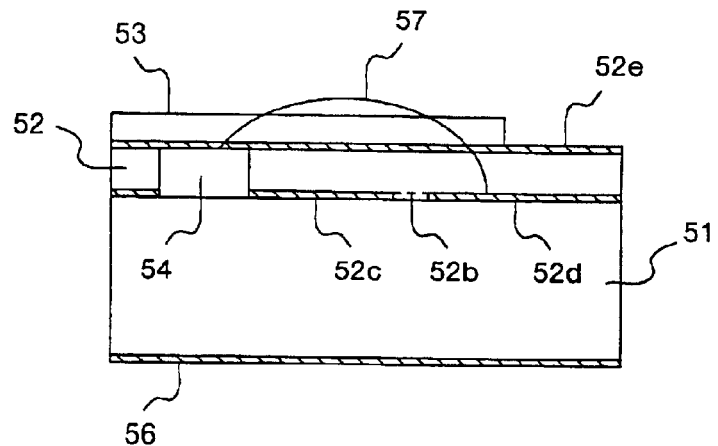
FIGS. 12A and 12B are right side view and a top view of the semiconductor laser device of the second embodiment.
Figure 12B:
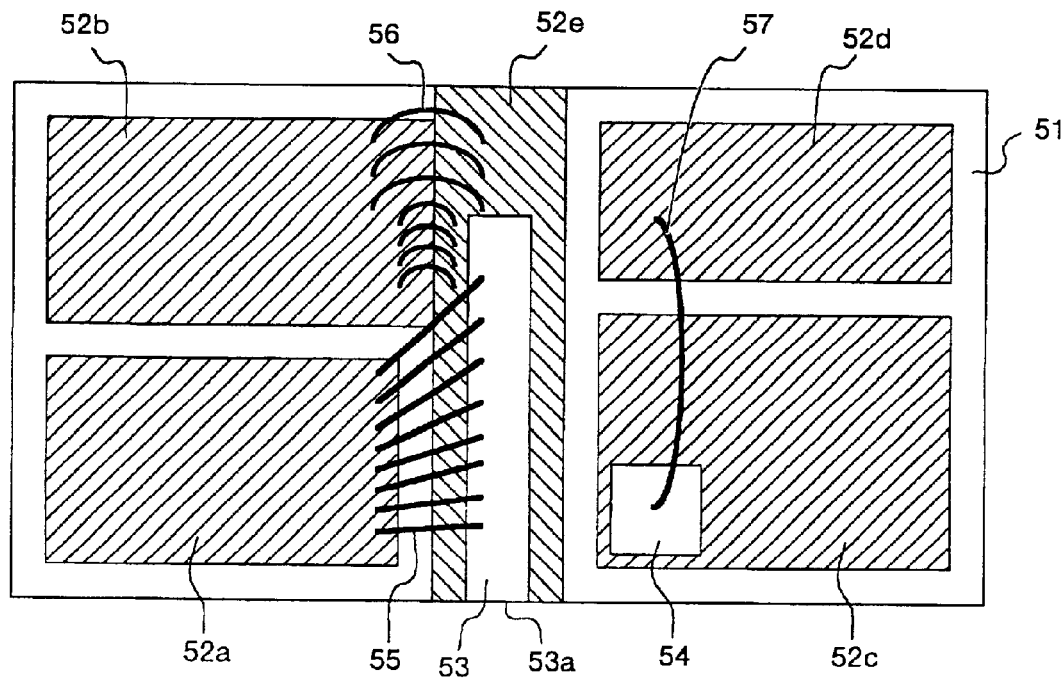

FIG. 11 is an illustration showing a configuration of the semiconductor laser device of the second embodiment. FIGS. 12A and 12B are a right side view and a top view respectively of a semiconductor laser device. In FIGS. 11 and 12, a base on which a carrier 51 is mounted, a Peltier element on which the base is mounted, and other control systems are not illustrated. Configurations and operations of these elements as described in the first embodiment discussion of FIG. 6A are applicable to the second embodiment.

In the case of the semiconductor laser device 50 shown in FIG. 11, the carrier 51 is formed by AlN having a high insulation characteristic and a high heat conductivity. As shown in FIGS. 12a and 12b, metallic thin films 52a to 52d are patterned and formed so as to be insulated from each other. The metallic thin films 52a to 52d are formed as a structure in which Ti, Pt, and Au are layered in order from the carrier 51 side with thicknesses of 60 nm, 200 nm, and 5,000 nm in order.

A diamond submount 52, the same as that of the first embodiment, is formed on the carrier 51 through the metallic thin film 52b. A semiconductor laser element 53 is formed on the submount 52 through the metallic thin film 52e. The semiconductor laser element 53 is a semiconductor laser elements same as the semiconductor laser element 20. The submount 52 secures the insulation of the semiconductor laser element 53 and functions as the heat sink of the semiconductor laser element 53 similarly to the case of the submount 42 described for the first embodiment.

The p-side electrode of the semiconductor laser element 53 at the active layer side is joined so as to face the submount 52 and the n-side electrode serves as an upper face. The p-side electrode and metallic thin film 52b of the semiconductor laser element 53 are electrically connected to each other through the metallic thin film 52e and an Au wire 56. Therefore, the metallic thin film 52e serves as a positive electrode of the semiconductor laser element 53 and the metallic thin film 52a serves as a negative electrode of the semiconductor laser element 53. Therefore, the configuration including the variable power source 200 and the current detector 201 is connected to wirings (not illustrated) extended from the metallic thin films 52 and 52b.

A plurality of wires 55 are used to electrically connect the n-side electrode and the metallic thin film 52a of the semiconductor laser element 53 to each other so as to increase the current carrying sectional area. Thereby, it is possible to reduce a resistance value produced at a wiring portion and a voltage drop at the portion. Reduction of the voltage drop contributes to suppression of heat to be produced and increase of a power ratio only used for a laser beam output and, as a result, improves a power light transformation efficiency. By making joints between the wires 55 almost equal intervals it is possible to disperse power. Thereby, it is possible to decrease the non-uniformity of voltage drops and, as a result, prevent both optical output and service life from deteriorating.

Bonding portions of the above wires 55 are linearly arranged in the longitudinal direction of the semiconductor laser element 53 as shown in FIG. 12B. However, it is also allowed to uniformly disperse the bonding portions on the surface of the n-side electrode of the semiconductor laser element 53. In this case, it is also possible to set the bonding portions to positions separate from the position of the active layer of the semiconductor laser element 53. It is preferable that currents are uniformly distributed via the wire 55 on the upper face of the semiconductor laser element 53, although, differing current flows are feasible as well, especially since the wires also serve as a heat sink.

As shown in FIGS. 11 and 12, a thermistor 54 for measuring the temperature of the semiconductor laser element 53 is set on the carrier 51 through the metallic thin film 52c. The bottom face of the thermistor 54 serving as one electrode is joined to the metallic thin film 52c and the upper face of the thermistor 54 serving as the other electrode is electrically connected with the metallic thin film 52d through a wire 57. Therefore, the temperature control section 202 shown in FIG. 6A is connected to wirings (not illustrated) extended from the metallic thin films 52c and 52d. An optical monitor (not shown) may be mounted on the carrier.

By setting the high output semiconductor laser element 53 so that an end face 53a of the semiconductor laser element 53 becomes almost flush with an end face of the carrier 51, it is possible to reduce the interference of a laser beam by the carrier. However, the placement of the end face 53a of the semiconductor laser element 53 cannot sufficiently receive the radiation effect by the submount 52 and, therefore, it is subjected to higher temperatures compared to other portions of the semiconductor laser element 53. For this reason, it is particularly preferable to set the thermistor 54 near the end face 53a of the semiconductor laser element 53 where the laser is emitted.

Because a submount is not used with the thermistor 54, the carrier 51 functions as the heat sink of the thermistor 54. Thus, the length and resistance of the heat conduction path between the semiconductor laser element 53 is reduced and the thermistor 54 can more quickly and accurately detect the actual temperature of the semiconductor laser element 53.

In FIGS. 11 and 12, the metallic thin film 52e on the submount 52 is connected with the metallic thin film 52b on the carrier 51 through the wire 56 and, a current can be carried to the p-side electrode of the semiconductor laser element 53. However, it is also possible to form a metallic thin film on a side face of the submount 52 and make the metallic thin film on the side face serve as the wire 56.

Figure 13:
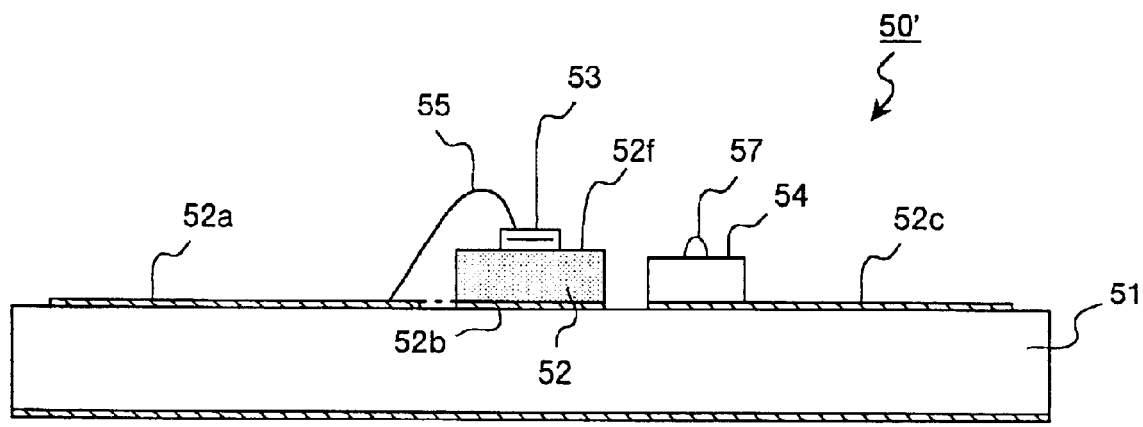
FIG. 13 is an illustration showing another configuration of the semiconductor laser device of the second embodiment.
Figure 14A:
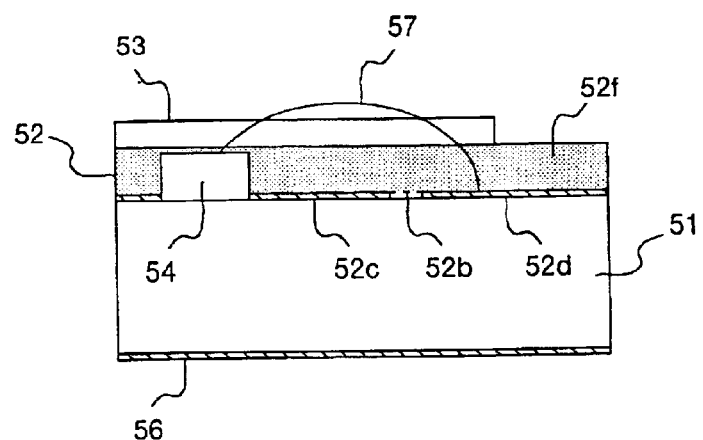
FIGS. 14A and 14B are a right side view and a top view, respectively, of the configuration of the semiconductor laser device of second embodiment shown in FIG. 13.
Figure 14B:
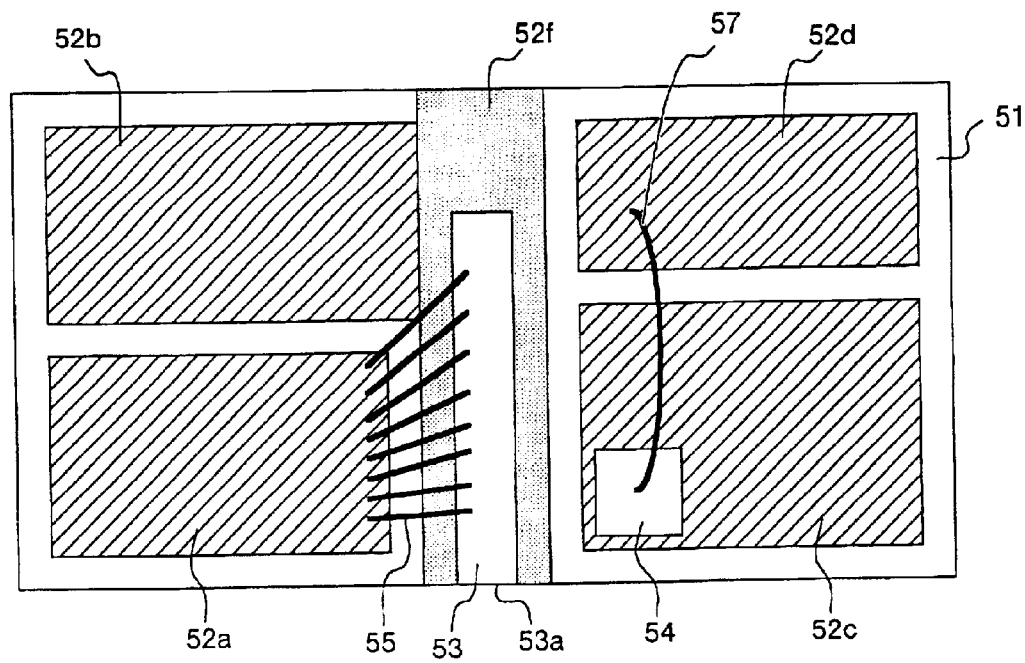

FIG. 13 is an illustration showing another configuration of the semiconductor laser device of the second embodiment in the above case. FIGS. 14A and 14B are a right side view and a top view of this alternative configuration. In FIGS. 13 and 14, elements common with FIGS. 11 and 12 are provided with the same symbol and so their description is omitted.

The semiconductor laser device 50' shown in FIGS. 13 and 14 is different from the semiconductor laser device in FIGS. 11 and 12 in that the wire 56 is excluded and the upper face and side face of the submount 52 are covered with a metallic thin film 52f. The metallic thin film 52f electrically contacts with the p-side electrode of the semiconductor laser element 53 located at the upper face of the submount 52 and the metallic thin film 52b on the carrier 51.

As described above, according to the semiconductor laser device of the second embodiment, it is possible to obtain advantages of the first embodiment because of forming the submount 52 set between the semiconductor laser element 53 and the carrier 51 by diamond having a high heat conductivity and quickly and accurately perform the temperature control by the thermistor 54, Peltier element 120, and temperature control section 202 because the thermistor 54 is set on the carrier 51 not through a submount and thereby, the heat conduction distance from the semiconductor laser element 53 to the thermistor 54 is decreased. Moreover, because the submount 52 is formed by diamond having a high heat conductivity in the path between the Peltier element 120, base 110, carrier 51, submount 52, and semiconductor laser element 53, it is also possible to quickly and accurately perform the temperature control by the Peltier element 120.

The semiconductor laser device of the third embodiment is described below. In the first or second embodiment, only a semiconductor laser element is set on a diamond submount. In the third embodiment, however, both a semiconductor laser element and a thermistor are set on a common diamond submount.

Figure 15:
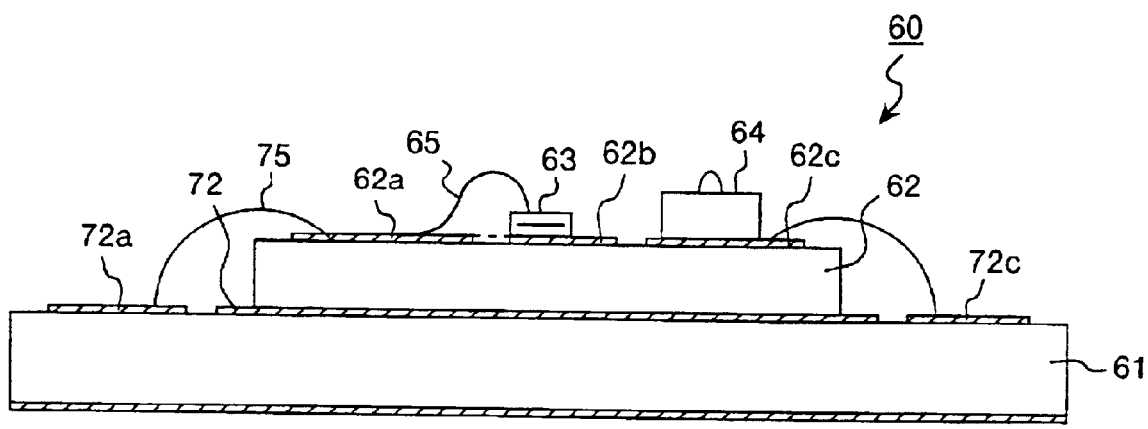
FIG. 15 is an illustration showing a configuration of the semiconductor laser device of the third embodiment.
Figure 16A:
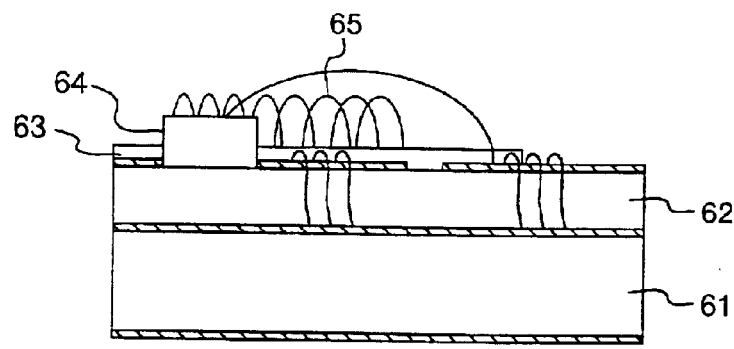
FIGS. 16A and 16B are a right side view and a top view, respectively, of the semiconductor laser device of the third embodiment.
Figure 16B:
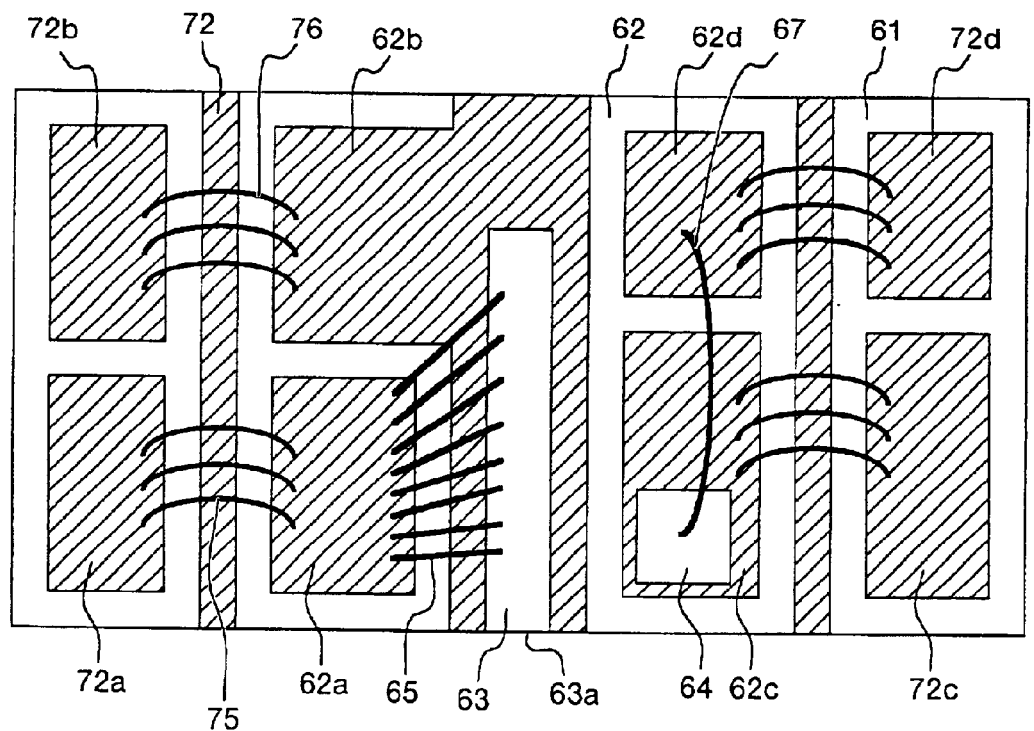

FIG. 15 is an illustration showing a configuration of the semiconductor laser device of the third embodiment. FIGS. 16A and 16B are a right side view and a top view of the semiconductor laser device. The structure of the semiconductor laser device of the third embodiment is described below by referring to the above three drawings. In FIGS. 15 and 16, a base on which a carrier 61 is mounted and a Peltier element on which the base is mounted, and other control systems are not illustrated. However, configurations and operations of these elements as described in the first embodiment discussion of FIG. 6A are applicable to the third embodiment.

In the case of the semiconductor laser device 60 shown in FIG. 15, the carrier 61 is formed by AlN having a high insulating characteristic and a high heat conductivity. Metallic thin films 72 and 72a to 72d are patterned and formed on the carrier 61 so as to be insulated from each other as shown in FIGS. 16a and 16b.

A diamond submount 62 similar to that of the first embodiment is set on the carrier 61 through the metallic thin film 72. Metallic thin films 62a to 62d are patterned and formed on the submount 62 so as to be insulated from each other as shown in FIGS. 16a and 16b. A semiconductor laser element 63 is set through the metallic thin film 62b and a thermistor 64 is set through the metallic thin film 62c on the submount 62. The semiconductor laser element 63 is a semiconductor laser element similar to the semiconductor laser element 20 described for the first embodiment. The submount 62 secures the insulation of the semiconductor laser element 63 and that of the thermistor 64 and functions as a heat sink similarly to the submount 42 described for the first embodiment.

The p-side electrode of the semiconductor laser element 63 at the active layer side is joined to the submount and the n-side electrode serves as an upper face. The n-side electrode of the semiconductor laser element 63 and the metallic thin film 72a on the carrier 61 are electrically connected to each other through an Au wire 65, the metallic thin film 62a, and an Au wire 75. The p-side electrode of the semiconductor laser element 63 and a metallic thin film 72b are electrically connected to each other through the metallic thin film 62b and an Au wire 76. The metallic thin film 72a serves as a negative electrode of the semiconductor laser element 63 and the metallic thin film 72b serves as a positive electrode of the semiconductor laser element 63. The configuration having the variable power source 200 and current detector 201 shown in FIG. 6A is connected to wirings (not illustrated) extended from the metallic thin films 72a and 72b.

As shown in FIGS. 15 and 16, the thermistor 64 for measuring the temperature of the semiconductor laser element 63 is set on the carrier 61 through the metallic thin film 62c. The thermistor 64 bottom face serving as one electrode is joined to the metallic thin film 62c and the upper face serving as the other electrode is electrically connected with the metallic thin film 62d through a wire 67. The temperature control section 202 shown in FIG. 6A is connected to wirings (not illustrated) extended from the metallic thin films 62c and 62d. The thermistor 64 is set to a position similar to the position of the thermistor 54 described for the second embodiment. An optical monitor (not shown) may also be mounted on the submount.

The semiconductor laser element 63 and thermistor 64 are set on the same diamond submount 62 and the submount 62 functions as the heat sink of the semiconductor laser element 63 and thermistor 64. Therefore, it is possible to reduce the length and resistance of the heat conducting path between the semiconductor laser element 63 and thermistor 64 compared to the case of setting an independent submount below the both or either of the semiconductor laser element 63 and thermistor 64. Thus, the thermistor 64 can quickly detect a temperature closer to the actual temperature of the semiconductor laser element 63.

As described above, according to the semiconductor laser device of the third embodiment, the submount 62 set between the semiconductor laser element 63 and carrier 61 and between the thermistor 64 and submount 62 is formed by diamond having a high heat conductivity and shared by the semiconductor laser element 63 and thermistor 64. Therefore, it is possible to further decrease the heat conduction distance between the semiconductor laser element 63 and the thermistor 64 and efficiently radiate the heat generated by the semiconductor laser element. The high efficiency radiation effect makes it possible to reduce the shift of a selective wavelength in a diffraction grating caused by heat, increase the output power of a laser beam to an injection current, and quickly and accurately perform the temperature control by the Peltier element 120 and temperature control section 202.

Moreover, in the path up to the Peltier element 120, base 110, carrier 61, submount 62, and semiconductor laser element 63, it is also possible to quickly and accurately perform the temperature control by the Peltier element 120 because the submount 62 is formed by diamond having a high heat conductivity.

The fourth embodiment is described below. The semiconductor laser module of the fourth embodiment is constituted by sealing the semiconductor laser device of any one of the first to third embodiments in a package together with various optical components, which is a module for easily guiding a laser beam generated by a semiconductor laser device into an optical fiber.

FIG. 17 is a longitudinal sectional view showing a configuration of the semiconductor laser module of the fourth embodiment. In FIG. 17, the semiconductor laser module 80 is constituted by setting the above Peltier element 120 on the internal bottom face of a package 81 formed by ceramics or the like. The above base 110 is set on the Peltier element 120 and a semiconductor laser device 90 is set on the base 110.

In this case, the semiconductor laser device 90 corresponds to the configuration having the carrier, diamond submount set on the carrier, and semiconductor laser element shown in any one of the first to third embodiments. As the Peltier element 120, base 110, semiconductor laser device 90, and the temperature control by a temperature control section are the same as described for the earlier embodiments, their description is omitted.

In FIG. 17, an optical monitor 83, a first lens 84, and an isolator 85 are arranged on the base 110 in addition to the semiconductor laser device 90. Furthermore, in the semiconductor laser module 80, a second lens 86 is set inside of a portion to which an optical fiber 82 is set. A laser beam emitted from the semiconductor laser device 90 is guided into the optical fiber 82 through the first lens 84, isolator 85, and second lens 86. The second lens 82 is set on the package 81 on the optical axis of the laser beam and optically coupled with the optical fiber 82 externally connected. The optical monitor 83 detects the light leaked from the reflection film side of the semiconductor laser device 90. The isolator 85 between the semiconductor laser device 90 and the optical fiber 82 prevents that the return light reflected from other optical components or the like return into a resonator and adversely affect the oscillating and detecting operations in the form of stray light. The isolator 85 is not an inline fiber type used for a conventional semiconductor laser module but a polarized wave independent type that can be built in the semiconductor laser module 80. Note that in the case of a conventional semiconductor laser device provided with a fiber grating (i.e., one without an embedded diffraction grating), it is impossible to set an isolator in the optical coupling system between a semiconductor laser and an optical fiber because of a structure of introducing light from an external resonator (FBG: Fiber Bragg Grating) and stabilizing the wavelength. Thus, performance is deteriorated as the relative intensity noise (RIN) is increased due to the light returned from the FBG or the return light reflected from other optical component. In the case of the semiconductor laser module 80 of this embodiment, however, because a diffraction grating is formed within a semiconductor laser element, it is possible to set an isolator for suppressing reflected return light in the optical coupling system between a semiconductor laser element and an optical fiber and reduce the relative intensity noise (RIN). However, an isolator is not always required.

In the first to fourth embodiments, the oscillation wavelength $\lambda_o$ of the semiconductor laser element 53 is set to 1,480 nm. However, the present invention can be also applied when using a semiconductor laser element having another oscillation wavelength, such as 980 nm.

In the first to fourth embodiments, the submount set immediately below the semiconductor laser element 53 is formed by a polycrystal diamond having a heat conductivity of 1,000 to 1,300 W/(m*K). However, use of any material having a heat conductivity higher than that of AlN {500 W/(m*K) or more}, such as CBN having a high heat conductivity of 600 W/(m*K) or more, can achieve similar advantages. It is more preferable to use single crystal diamond as the above submount because single crystal diamond has a heat conductivity of 2,000 W/(m*K).

As described above, a semiconductor laser device in each embodiment of the present invention includes a semiconductor laser element with diffraction gratings capable of outputting a laser beam with a plurality of oscillation longitudinal modes at a threshold value just below where stimulated Brillouin scattering occurs, or less. This device also includes a submount formed by diamond or another material with high thermal conductivity set between the semiconductor laser element and a carrier. This results in an ability to more efficiently transfer heat to or from a semiconductor laser element as compared to the case of using a conventional AlN submount and, as a result, reduces the shift of a selective wavelength in a diffraction grating generated due to heat, and increases the output power of a laser beam for a given injection current. In addition, each embodiment allows for improved thermistor performance and thus more rapid and accurate temperature control. Finally, because the above semiconductor laser device is formed into a module, it is possible to reduce return light by a polarized wave independent isolator and thereby accelerate reduction of noise and reduction of the number of components.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

This document claims the benefit of the earlier filing date of Japanese patent application 2001-285810, filed in the Japanese Patent Office on Sep. 19, 2001 respectively, and the entire content of which being incorporated herein by reference.

What is claimed is:

1. A semiconductor laser device comprising:
   a first mount;
   a second mount formed by a heat sink having a heat conductivity of 500 W(m*K) or more and joined to the first mount through a first multi-layer film including a gold thin film; and
   a semiconductor laser element joined to the second mount through a second multi-layer film including a gold thin film, said semiconductor element having a diffraction grating, an emission edge, a reflection edge and an active layer positioned to output a laser beam having a plurality of oscillation longitudinal modes through the emission edge, and
   the plurality of oscillation longitudinal modes are output in accordance with a wavelength selection characteristic of the diffraction grating formed between the emission edge and the reflection edge and nearby the active layer.

2. The semiconductor laser device according to claim 1, further comprising:
   a third mount joined to the first mount through a third multi-layer film including a gold thin film; and
   a temperature measuring element joined to the third mount through a fourth multi-layer film including a gold thin film and configured to measure a temperature of the semiconductor laser element.

3. The semiconductor laser device according to claim 2, wherein:
   the second mount comprises diamond.

4. The semiconductor laser device according to claim 3, wherein:
   the second mount is configured to minimize heat resistance relative to a semiconductor laser element length, width and thickness.

5. The semiconductor laser device according to claim 4, wherein:
   the second mount has a thickness of at least 0.4 mm, a length of at least 3.2 mm and a width of at least 3.2 mm when the semiconductor laser element is configured to have a thickness of not more than 0.13 mm, a length of not more than 3.2 mm and a width not more than of 0.35 mm.

6. The semiconductor laser device according to claim 4, wherein:
   the second mount has a thickness of at least 0.3 mm, a length of at least 2.7 mm and a width of at least 1.0 mm when the semiconductor laser element is configured to have a thickness not more than of 0.13 mm, a length of not more than 2.7 mm and a width of not more than 0.35 mm.

7. The semiconductor laser device according to claim 3, wherein:
   the second mount comprises a polycrystal diamond.

8. The semiconductor laser device according to claim 1, further comprising:
   a temperature measuring element joined to the first mount through a third multi-layer film including a gold thin film and configured to measure a temperature of the semiconductor laser element.

9. The semiconductor laser device according to claim 8, wherein:
   the second mount comprises diamond.

10. The semiconductor laser device according to claim 9, wherein:
    the second mount is configured to minimize heat resistance relative to a semiconductor laser element length, width and thickness.

11. The semiconductor laser device according to claim 10, wherein:
    the second mount has a thickness of at least 0.4 mm, a length of at least 3.2 mm and a width at least of 3.2 mm when the semiconductor laser element is configured to have a thickness nor more than of 0.13 mm, a length of 3.2 mm and a width not more than of 0.35 mm.

12. The semiconductor laser device according to claim 10, wherein:
    the second mount has a thickness of at least 0.3 mm, a length of at least 2.7 mm and a width of at least 1.0 mm when the semiconductor laser element is configured to have a thickness of not more than 0.13 mm, a length of 2.7 mm and a width of not more than 0.35 mm.

13. The semiconductor laser device according to claim 9, wherein:
    the second mount comprises a polycrystal diamond.

14. The semiconductor laser device according to claim 9, wherein:
    the second mount is covered with a metallic foil including a gold thin film.

15. The semiconductor laser device according to claim 1, further comprising:
    a temperature measuring element joined to the second mount through a third multi-layer film including a gold thin film and configured to measure a temperature of the semiconductor laser element.

16. A semiconductor laser module comprising:
    a semiconductor laser device having
      a first mount,
      a second mount formed by a heat sink having a heat conductivity of 500 W/(m*K) or more and joined to the first mount through a first multi-layer film including a gold thin film, and
      a semiconductor laser element, joined to the second mount through a second multi-layer film including a gold thin film, and having a diffraction grating, an emission edge, a reflection edge and an active layer positioned to produce a laser beam having a plurality of oscillation longitudinal modes that is emitted through said emission edge, wherein the plurality of oscillation longitudinal modes are output in accordance with a wavelength selection characteristic of the diffraction grating formed between the emission edge and the reflection edge of the laser element and nearby the active layer of the laser element;

an optical fiber configured to guide the laser beam outside the module; and an optical coupling lens system that couples the semiconductor laser device to the optical fiber.

17. The semiconductor laser module according to claim 16, further comprising an isolator set in the optical coupling lens system and configured to suppress a return light reflected from an optical fiber side of the optical coupling lens system.

18. The semiconductor laser module according to claim 16, wherein:

the semiconductor laser device comprises a third mount joined to the first mount through a third multi-layer film including a gold thin film; and a temperature measuring element joined to the third mount through a fourth multi-layer film including a gold thin film and configured to measure a temperature of the semiconductor laser element.

19. The semiconductor laser module according to claim 18, wherein:

the second mount comprises diamond.

20. The semiconductor laser module according to claim 19, wherein:

the second mount is configured to minimize heat resistance relative to a semiconductor laser element length, width and thickness.

21. The semiconductor laser module according to claim 20, wherein:

the second mount has a thickness of at least 0.4 mm, a length of at least 3.2 mm and a width of at least 3.2 mm when the semiconductor laser element is ;used to have a thickness of 0.13 mm, a length of 1.5 mm and a width of 0.35 mm.

22. The semiconductor laser module according to claim 20, wherein:

the second mount has a thickness of at least 0.3 mm, a length of at least 2.7 mm and a width of 1.0 mm when the semiconductor laser element is configured to have a thickness not more than 0.13 mm, a length of 1.5 mm and a width of not more than 0.35 mm.

23. The semiconductor laser module according to claim 19, wherein:

the second mount comprises a polycrystal diamond.

24. The semiconductor laser module according to claim 16, wherein:

the semiconductor laser device comprises a temperature measuring element joined onto the first mount through a third multi-layer film including a gold thin film and configured to measure a driving temperature of the semiconductor laser element.

25. The semiconductor laser module according to claim 24, wherein: the second mount comprises diamond.

26. The semiconductor laser module according to claim 25, wherein:

the second mount is configured to minimize heat resistance relative to a semiconductor laser element length, width and thickness.

27. The semiconductor laser module according to claim 26, wherein:

the second mount is configured to have a thickness of at least 0.4 mm, a length of at least 3.2 mm and a width of at least 3.2 mm when the semiconductor laser element is configured to have a thickness of not more than 0.13 mm, a length of 3.2 mm and a width of not more than 0.35 mm.

28. The semiconductor laser module according to claim 26, wherein:

the second mount is configured to have a thickness of at least 0.3 mm, a length of at least 2.7 mm and a width of at least 1.0 mm when the semiconductor laser element is configured to have a thickness of not more than 0.13 mm, a length of 2.7 mm and a width not more than of 0.35 mm.

29. The semiconductor laser module according to claim 25, wherein:

the second mount comprises a polycrystal diamond.

30. The semiconductor laser module according to claim 25, wherein:

the second mount is covered with a metallic foil including a gold thin film.

31. The semiconductor laser module according to claim 16, wherein:

the semiconductor laser device further comprises a temperature measuring element joined onto the second mount through a third multi-layer film including a gold thin film and configured to measure a driving temperature of the semiconductor laser element.

32. A semiconductor laser device comprising:

a first mount;

a second mount formed by a heat sink having a heat conductivity of 500 W/(m*K) or more and joined onto the first mount through a first multi-layer film including a gold thin film;

a semiconductor laser element joined onto the second mount through a second multi-layer film including a gold thin film;

means for outputting a laser beam having a plurality of oscillation longitudinal modes in accordance with a wavelength selection characteristic of a diffraction grating formed between an emission edge and a reflection edge of the laser element and nearby an active layer of the laser element; and means for suppressing a deterioration of optical output and service life of the semiconducting laser element, including means for measuring a temperature of the semiconductor laser element, and means for controlling the temperature of the semiconductor laser element.

33. A semiconductor laser module comprising:

a semiconductor laser device configured to emit a laser beam and having a first mount, a second mount formed by a heat sink having a heat conductivity of 500 W/(m*K) or more and joined onto the first mount through a first multi-layer film including a gold thin film, and a semiconductor laser element joined onto the second mount through a second multi-layer film including a gold thin film;

an optical fiber for guiding the laser beam outside the module;

an optical coupling lens system for optically coupling the semiconductor laser device with the optical fiber;

means for outputting a laser beam having a plurality of oscillation longitudinal modes in accordance with a wavelength selection characteristic of a diffraction grating formed between an emission edge and a reflection edge of the laser element and nearby an active layer of the laser element;

means for measuring a temperature of the semiconductor laser element; and means for controlling the temperature of the semiconductor laser element.

* * * * *